(12) United States Patent
Hsieh

(10) Patent No.: US 10,465,735 B1
(45) Date of Patent: Nov. 5, 2019

(54) SHEET MEMBER FASTENER

(71) Applicant: KANG YANG HARDWARE ENTERPRISES CO., LTD., New Taipei (TW)

(72) Inventor: Shu-Li Hsieh, New Taipei (TW)

(73) Assignee: KANG YANG HARDWARE ENTERPRISES CO., LTD., New Taipei (TW)

( * ) Notice: Subject to any disclaimer, the term of this patent is extended or adjusted under 35 U.S.C. 154(b) by 0 days.

(21) Appl. No.: 16/235,136

(22) Filed: Dec. 28, 2018

(30) Foreign Application Priority Data

Aug. 16, 2018  (TW) .............................. 107211262 U

(51) Int. Cl.
  *F16B 37/04*  (2006.01)
  *H05K 7/12*  (2006.01)

(52) U.S. Cl.
  CPC ............. *F16B 37/043* (2013.01); *H05K 7/12* (2013.01)

(58) Field of Classification Search
  CPC ........ F16B 37/043; H05K 7/12; H05K 7/1404
  See application file for complete search history.

(56) References Cited

U.S. PATENT DOCUMENTS

| | | | | |
|---|---|---|---|---|
| 4,188,148 A * | 2/1980 | Waibel | .................. | F16B 5/0614 403/258 |
| 4,470,178 A * | 9/1984 | Matsui | .................... | F16B 5/065 174/138 D |
| 4,524,494 A * | 6/1985 | Sato | ....................... | F16B 21/082 174/138 D |
| 4,681,288 A * | 7/1987 | Nakamura | .............. | F16B 5/065 24/453 |
| 4,781,488 A * | 11/1988 | Hayashi | ................. | H05K 7/142 174/138 D |
| 4,966,482 A * | 10/1990 | Fujimoto | .............. | F16B 5/0607 403/24 |
| 5,632,649 A * | 5/1997 | Spangler | ............ | H01R 12/7064 439/567 |
| 6,726,505 B2 * | 4/2004 | Cermak, III | ............ | G06F 1/184 174/138 D |
| 6,923,407 B2 * | 8/2005 | Takeuchi | ................ | F16B 21/02 24/458 |
| 7,563,119 B2 * | 7/2009 | Hsu | .......................... | H05K 7/12 439/326 |

(Continued)

FOREIGN PATENT DOCUMENTS

TW       M562490       6/2018

*Primary Examiner* — Robert Sandy
*Assistant Examiner* — Louis A Mercado
(74) *Attorney, Agent, or Firm* — Guice Patents PLLC

(57) ABSTRACT

A sheet member fastener includes: a positioning unit, having a main body formed with a recess, wherein a first guiding inclined surface is formed at a top end of each shaft hole, and a surface of the main body is disposed with a first fastening structure and/or a second fastening structure allowing a first sheet member to be fastened; and a buckling unit, having a rotating part received in the recess and having two sides disposed with a pair of pivotal shafts, and one free end of each pivotal shaft is formed with a second guiding inclined surface, thereby allowing the pivotal shafts to be pivoted in the shaft holes; wherein one side of the rotating part is formed with at least one buckling slot capable of being buckled with a second sheet member, another side thereof is obliquely extended with a pushing rod.

13 Claims, 14 Drawing Sheets

(56) References Cited

U.S. PATENT DOCUMENTS

| | | | | |
|---|---|---|---|---|
| 7,896,596 B2* | 3/2011 | Rausch | ............... | F16B 37/041 |
| | | | | 411/174 |
| 9,271,062 B2* | 2/2016 | Wu | ............... | H04R 1/025 |
| 9,816,547 B2* | 11/2017 | Costabel | ............... | F16B 37/044 |
| 2007/0105425 A1* | 5/2007 | Wang | ............... | H05K 7/142 |
| | | | | 439/326 |

* cited by examiner

A-A

B-B

C-C

E-E

F-F though a metal pipe being processed with a thermal treatment, so that the cost for forming the connecting member is high and the production cost of the LED fastener is inevitably increased; therefore, there is still room for improvement.

SHEET MEMBER FASTENER

BACKGROUND OF THE INVENTION

1. Field of the Invention

The present invention relates to fastener, especially to a sheet member fastener which can be used for fastening a sheet member, for example a printed circuit board, and locking another sheet member, for example a WIFI network card, a 3G network card, a M2.0 solid state hard drive, an assembly board or a printed circuit board.

2. Description of Related Art

A sheet member fastener commonly adopted is an electronic device and used for fastening and separating two sheet members. Taiwan Patent Registration No. M562490 has disclosed a LED fastener having pivotal rotation positioning structure. The LED fastener is respectively fastened with a sheet member and a circuit board, and includes a base having a main body and a pivotal seat connected to one side of the main body, one end of the main body is disposed with a LED, another end thereof is fastened with the circuit board, the pivotal seat had two lateral plates, a pivotal slot formed between the lateral plates and a first shaft hole respectively formed on the lateral plates; a buckling unit pivoted with the pivotal seat, the buckling unit has a rotating part received in the pivotal slot and a buckling part connected to the rotating part, the rotating part is formed with a second shaft hole corresponding to the first shaft holes, the buckling part has a buckling slot for fastening the sheet member; and a connecting unit respectively passing and positioning the first shaft holes and the second shaft hole.

In actual practice, the connecting unit is a spring pin. When being assembled, the rotating part is inserted into the pivotal slot, the second shaft hole of the rotating part is aligned with the first shaft holes of the pair of lateral plates, then the connecting unit is inserted in the first shaft holes and the second shaft hole, thereby enabling the rotating part to be pivoted in the pivotal seat via the connecting unit. However, the installation of the connecting unit increases an additional aligning procedure for the first shaft holes and the second shaft hole, and an additional inserting procedure for pivoting the first shaft holes and the second shaft hole, thus unnecessary labor and working hours are caused, and the connecting unit, for example the spring pin, is formed through a metal pipe being processed with a thermal treatment, so that the cost for forming the connecting member is high and the production cost of the LED fastener is inevitably increased; therefore, there is still room for improvement.

SUMMARY OF THE INVENTION

One primary objective of the present invention is to provide a sheet member fastener, in which a specially-design pivotal connecting mechanism is adopted to replace the spring pins used in the prior art, so that an operating procedure of aligning a plurality of holes can be saved, the production cost can be effectively lowered and advantages of reducing labor and working hours are also provided.

For achieving said objective, one technical solution provided by the present invention is to provide a sheet member fastener, which includes a positioning unit, having a main body transversally formed with a recess at a top end, wherein a pair of lateral walls are defined at two opposite sides of the recess, the pair of lateral walls are oppositely formed with a pair of shaft holes, a first guiding inclined surface is formed at a top end of each of the shaft holes, and a surface of the main body is disposed with a first fastening structure and/or a second fastening structure allowing a first sheet member to be connected and fastened; and a buckling unit, having a rotating part received in the recess, wherein two sides of the rotating part are disposed with a pair of pivotal shafts arranged correspondingly towards the pair of shaft holes, and one free end of each of the pivotal shafts is formed with a second guiding inclined surface capable of being longitudinally and downwardly displaced along the corresponding first guiding inclined surface, thereby allowing the pair of pivotal shafts to be pivoted in the pair of shaft holes; wherein a latching slot is formed on a bottom wall at a bottom end defined inside the recess, a latching hook is disposed on a block wall defined at a bottom end of the rotating part, and the latching slot and the latching hook are able to be mutually latched; one side of the rotating part is formed with at least one buckling slot capable of being buckled with a second sheet member, another side thereof is obliquely extended with a pushing rod; the at least one buckling slot is able to generate a reverse rotation through the pushing rod being pushed, so that the latching hook is released from the latching slot, and the at least one buckling slot is released from the second sheet member so as to form an unlocked status; or the latching hook is latched in the latching slot for enabling the at least one buckling slot to be buckled with the second sheet member so as to form a locked status.

According to one embodiment of the present invention, a pressing piece is disposed above each of the buckling slots.

According to one embodiment of the present invention, the first fastening structure is disposed on outer circumferences of the pair of lateral walls, and has at least one connecting hook disposed on each of the lateral walls, and a protrusion disposed on the at least one connecting hook and spaced with intervals, so that a connecting slot capable of being connected and buckled with the first sheet member is formed between the at least one connecting hook and the protrusion of each of the lateral walls.

According to one embodiment of the present invention, each of the connecting slots is formed in a planar status; each of the first guiding inclined surfaces is formed on a top surface of the protrusion of each of the lateral walls, and arranged to be adjacent to the shaft hole located below.

According to one embodiment of the present invention, the pair of lateral walls are formed with a pair of supporting concave parts oriented towards the second sheet member and used for supporting the second sheet member, the pair of supporting concave parts are separated by the recess, located in front of the pair of protrusions and the height thereof is lower than that of the pair of protrusions; wherein an adjacent surface of each of the protrusions and each of the supporting concave parts is disposed with a vertical post, a top surface of the vertical post is formed with a bottom guiding inclined surface, so that the second sheet member is able to be guided into the supporting concave part along the bottom guiding inclined surface so as to be positioned.

According to one embodiment of the present invention, the second fastening structure is disposed at the bottom end of the main body, and has an arrow-shaped fastening hook protruded from the bottom end of the main body, a pair of elastic hook pieces outwardly extended from the fastening hook, and a plurality of teeth steps arranged in a stepped means and oppositely formed at free ends of the pair of elastic hook pieces and capable of being buckled in a first sheet hole of the first sheet member; wherein, opposite longitudinal surfaces of the fastening hook are protruded with at least one arc-shaped convex part.

According to one embodiment of the present invention, an abutting rod is disposed between the rotating part and the pushing rod, when the sheet member fastener is in the locked status, the abutting rod is abutted against an edge of the second sheet member, thereby preventing the second sheet member from transversally sliding.

According to one embodiment of the present invention, when the block wall is abutted against the bottom wall, a limitation for the pushing rod being pushed along one rotating direction is formed; when the latching hook is latched in the latching slot, a limitation for the pushing rod being pushed along another rotating direction is formed.

According to one embodiment of the present invention, the second fastening structure has an arrow-shaped fastening hook protruded from the bottom end of the main body, a pair of elastic hook pieces are outwardly extended from one free end of the fastening hook, a fastening block having the same shape as the first sheet hole of the first sheet member is formed at a connecting location of the fastening hook and the main body, and the fastening block is oppositely extended with a pair of elastic fin pieces capable being elastically abutted against the first sheet member.

According to one embodiment of the present invention, the second fastening structure has a locking hole longitudinally formed at the bottom end of the main body, a pair of semilunar insertion tenons are protruded from the bottom end of the main body and oppositely arranged, the pair of insertion tenons are inserted in the first sheet hole having a shape corresponding to the pair of insertion tenons, and an arc-shaped slit communicated with the locking hole is formed between the pair of insertion tenons, and a locking piece is provided and capable of passing the slit and locked in the locking hole.

According to one embodiment of the present invention, outer circumferences of a pair of free ends of each of the insertion tenons are oppositely formed with a pair of convex tenons, a gap is formed between the convex tenons and the first sheet hole during a process of the locking piece being locked, so that the free ends are transversally expanded by the locking piece for being abutted against two sides of the first sheet hole, and the pair of insertion tenons are aimed at other two sides of the first sheet hole for being squeezed, thereby forming a tight combining relation.

BRIEF DESCRIPTION OF THE DRAWINGS

The present invention will be apparent to those skilled in the art by reading the following detailed description of a preferred embodiment thereof, with reference to the attached drawings, in which.

DETAILED DESCRIPTION OF THE PREFERRED EMBODIMENT

Please refer from FIG. 1 to FIG. 6, a sheet member fastener including a positioning unit 1 and a buckling unit 2 is provided by the present invention. The positioning unit 1 and the buckling unit 2 are made of an insulation polymer material, such as Nylon, and formed through an injection molding means, thereby being provided with an insulating effect.

Figure 5:
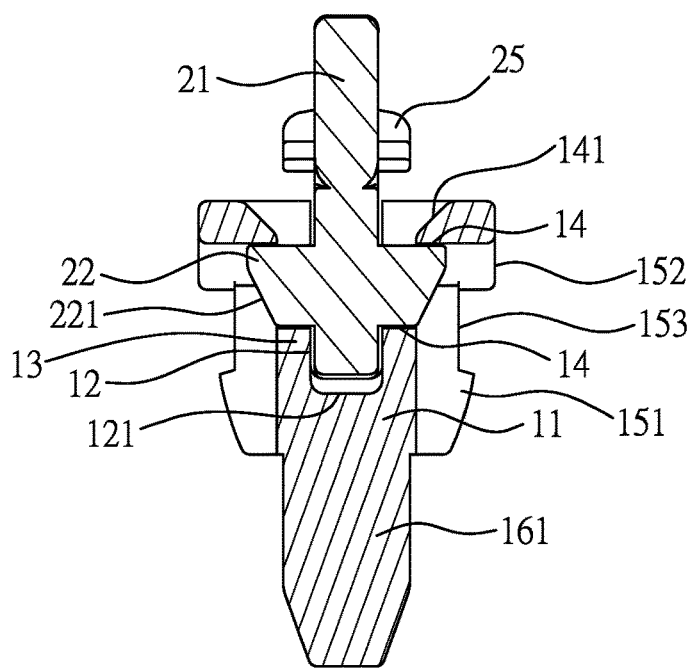
FIG. 5 is a cross sectional view of FIG. 3 taken along a B-B line for illustrating the pivotal shaft being pivoted in the shaft hole.

The positioning unit 1 has a main body 11, a top end of the main body 11 is transversally formed with a recess 12, and a pair of lateral walls 13 are defined at two opposite sides of the recess 12. The pair of lateral walls 13 are oppositely formed with a pair of shaft holes 14, and a top end of each of the shaft holes 14 is formed with a first guiding inclined surface 141 inclined towards the recess 12. A bottom wall 121 inside the recess 12 is formed with a latching slot 122 (as shown in FIG. 5) of a latching mechanism, thereby allowing the buckling unit 2 to be latched and positioned.

Figure 1:
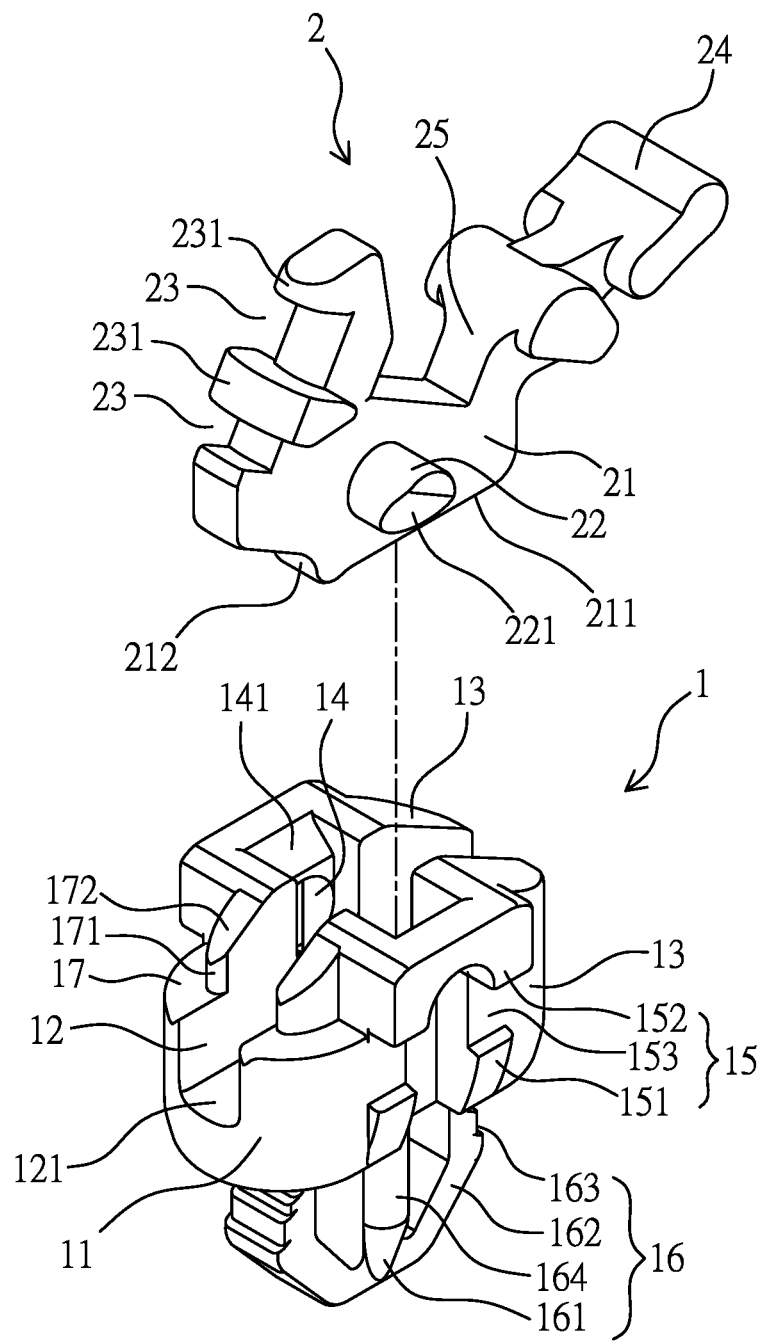
FIG. 1 is a perspective view illustrating a sheet member fastener according to a first embodiment of the present invention.
Figure 2:
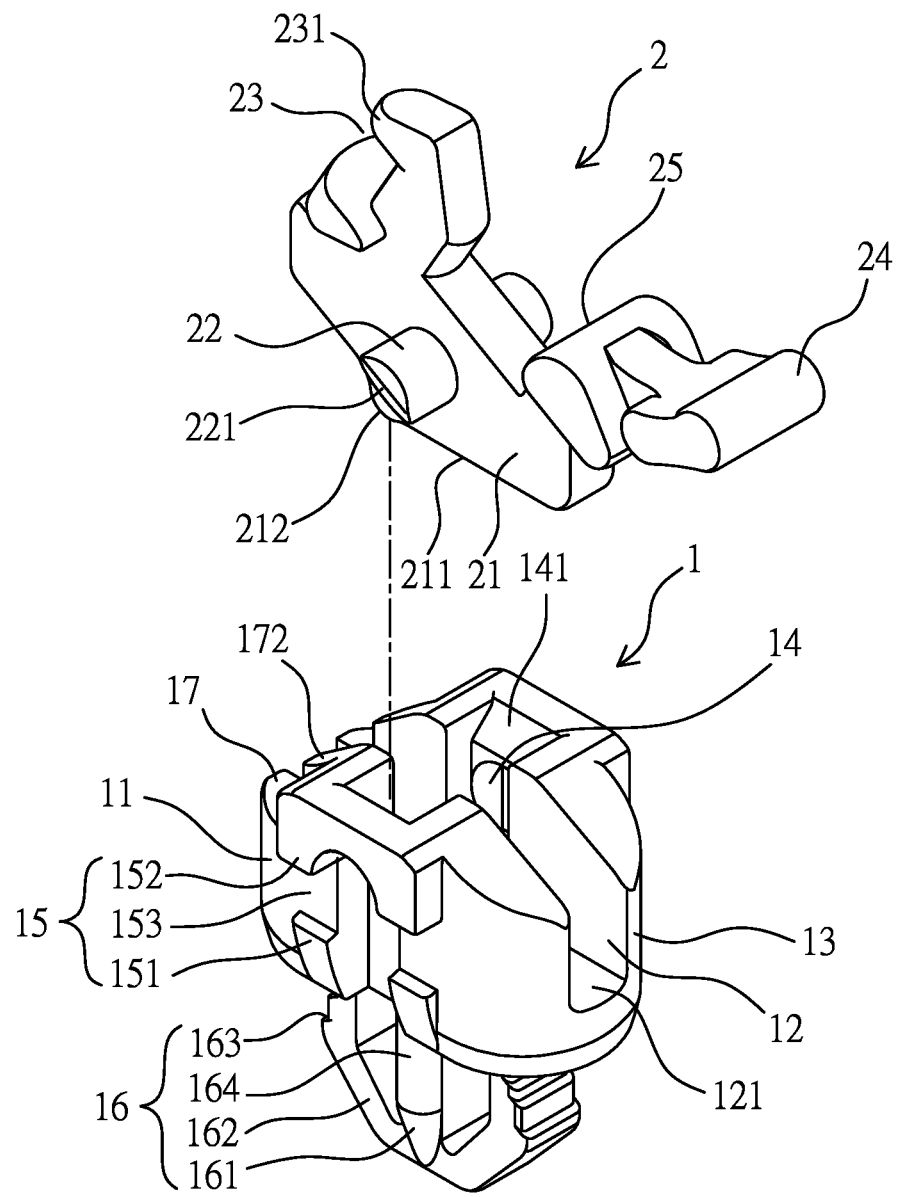
FIG. 2 is another perspective view illustrating the sheet member fastener according to the first embodiment of the present invention.
Figure 3:
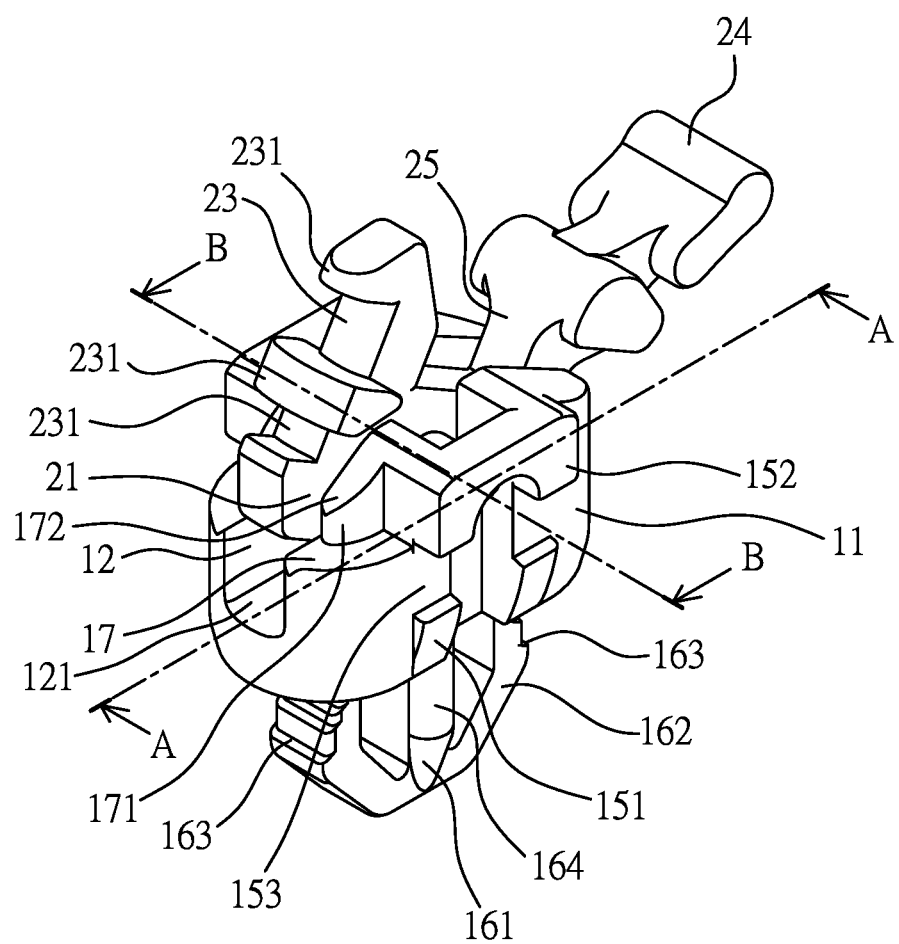
FIG. 3 is a perspective view illustrating the assembly of the sheet member fastener according to the first embodiment of the present invention.
Figure 7:
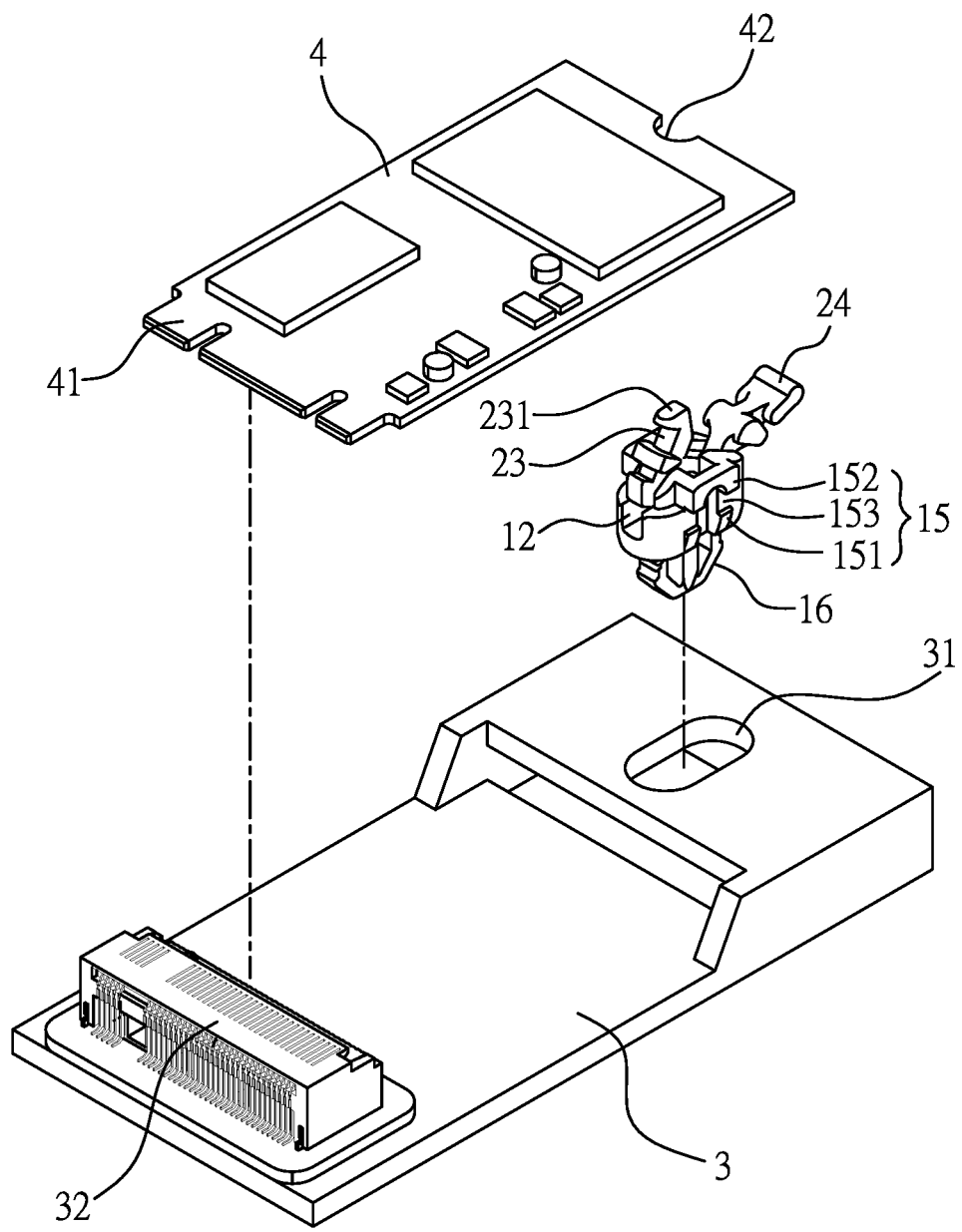
FIG. 7 is a perspective view illustrating a first example showing a process of the first fastening structure of the sheet member fastener being utilized for being combined with the first sheet member and the second sheet member according to the first embodiment of the present invention.
Figure 8:
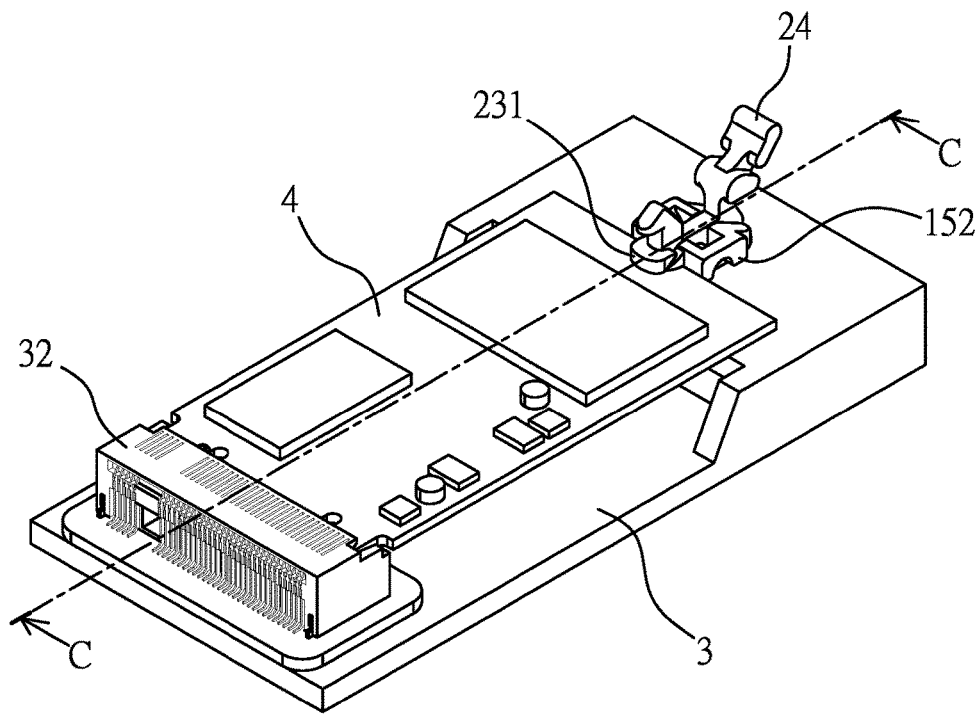
FIG. 8 is another perspective view illustrating the first example showing the process of the first fastening structure of the sheet member fastener being utilized for being combined with the first sheet member and the second sheet member according to the first embodiment of the present invention.

For enabling the main body 11 to be fastened with a first sheet member 3 (as shown in FIG. 7 and FIG. 8), an outer circumference of the main body 11, in other words opposite outer circumferences of the pair of lateral walls 13, is disposed with a first fastening structure 15. As shown in FIG. 1, the first fastening structure 15 has at least one connecting hook 151 disposed at each of the lateral walls 13 and oriented to be inclined towards downward, and a protrusion 152 arranged on the at least one connecting hook 151 and spaced with intervals, so that a connecting slot 153 capable of being connected and buckled with the first sheet member 3 is formed between the at least one connecting hook 151 and the protrusion 152 of each of the lateral walls 13. Wherein, each of the connecting slots 153 is formed in a planar status, so that an anti-rotating function is provided to the sheet member fastener. Moreover, each of the first guiding inclined surfaces 141 is formed on a top surface of the protrusion 152 of each of the lateral walls 13, and arranged to be adjacent to the shaft hole 14 located below the first guiding inclined surface 14, thereby enabling the buckling unit 2 to be easily buckled.

Figure 10:
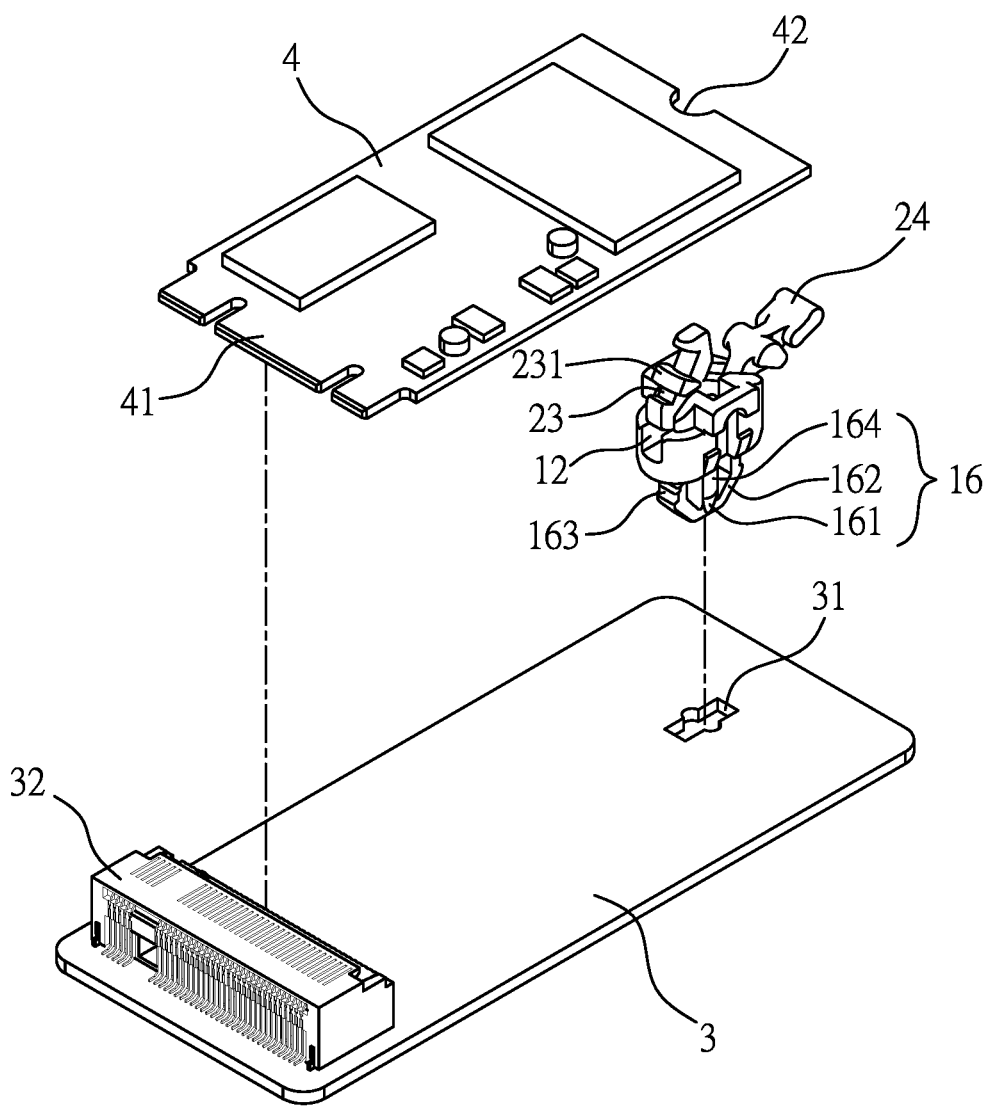
FIG. 10 is a perspective view illustrating the first example showing a process of the second fastening structure of the sheet member fastener being utilized for being combined with the first sheet member and the second sheet member according to the first embodiment of the present invention.
Figure 11:
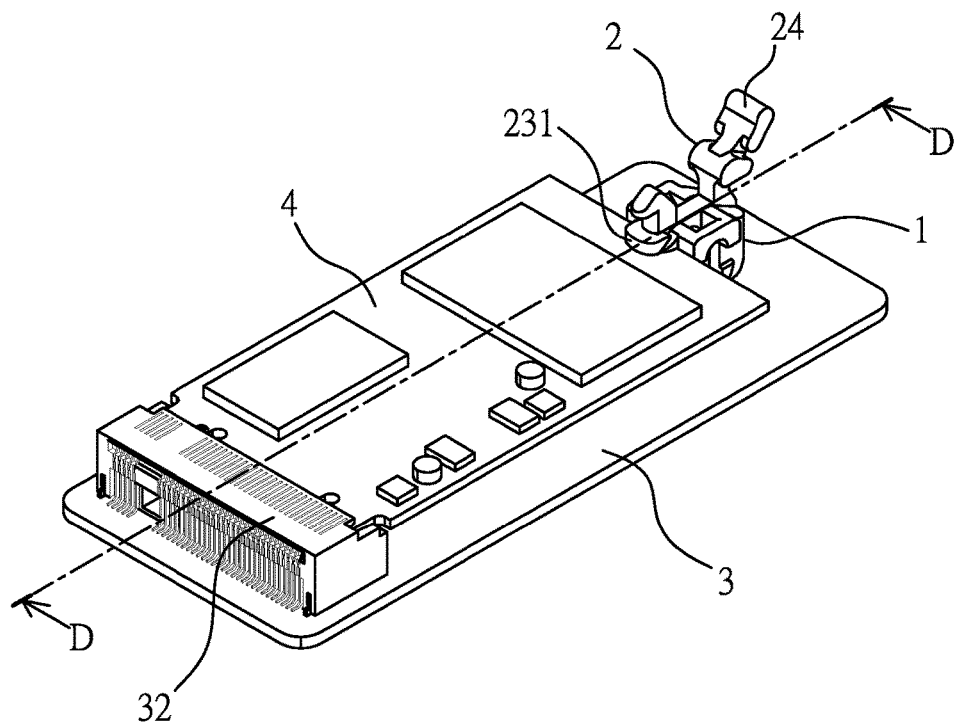
FIG. 11 is another perspective view illustrating the first example showing the process of the second fastening structure of the sheet member fastener being utilized for being combined with the first sheet member and the second sheet member according to the first embodiment of the present invention.

A second fastening structure 16 (as shown in FIG. 10 and FIG. 11) capable of being with fastened the first sheet member 3 is disposed on a bottom surface of the main body 11; as shown from FIG. 1 to FIG. 5, the second fastening structure 16 has an arrow-shaped fastening hook 161 protruded from a bottom end of the main body 11, a pair of elastic hook pieces 162 outwardly extended from the fastening hook 161, a plurality of teeth steps 163 arranged in a stepped means and oppositely formed at free ends of the pair of elastic hook pieces 162, thereby being able to be buckled with the first sheet member 3 having different thicknesses or a first sheet hole 31 having different diameters, so as to expand the applicable range. Wherein, opposite longitudinal surfaces of the fastening hook 161 are protruded with at least one arc-shaped convex part 164, the fastening hook 161 and the at least one arc-shaped convex part 164 can be inserted into a T-shaped first sheet hole or a cross-shaped first sheet hole, so that an anti-rotating function can be provided via the at least one arc-shaped convex part 164.

What shall be addressed is that the first fastening structure 15 and the second fastening structure 16 can be individually disposed on the positioning unit 1, or the first fastening structure 15 and the second fastening structure 16 can be both disposed on the positioning unit 1.

Moreover, for enabling the main body 11 to be provided with an effect of supporting a second sheet member 4 (as shown in FIG. 7 and FIG. 8), the pair of lateral walls 13 are formed with a pair of symmetrical supporting concave parts 17 oriented towards the direction of the second sheet member 4, for example the front direction, the pair of supporting concave parts 17 are separated by the recess 12, located in front of the pair of protrusions 152 and the height thereof is lower than that of the pair of protrusions 152, wherein an adjacent surface of each of the protrusions 152 and each of the supporting concave parts 17 is disposed with a vertical post 171, a top surface of the vertical post 171 is formed with a bottom guiding inclined surface 172, so that the second sheet member 4 can be guided into the supporting concave part 17 along the bottom guiding inclined surface 172 so as to be positioned.

The buckling unit 2 has a rotating part 21 received in the recess 12, two sides of the rotating part 21 are disposed with a pair of pivotal shafts 22 which are correspondingly arranged towards the pair of shaft holes 14, and one free end of each of the pivotal shafts 22 is formed with a second guiding inclined surface 221, so that the second guiding inclined surface 221 of the pivotal shaft 22 can be longitudinally and downwardly displaced along the corresponding first guiding inclined surface 141, thereby allowing the pair of pivotal shafts 22 to be pivoted in the pair of the shaft holes 14.

Figure 4:
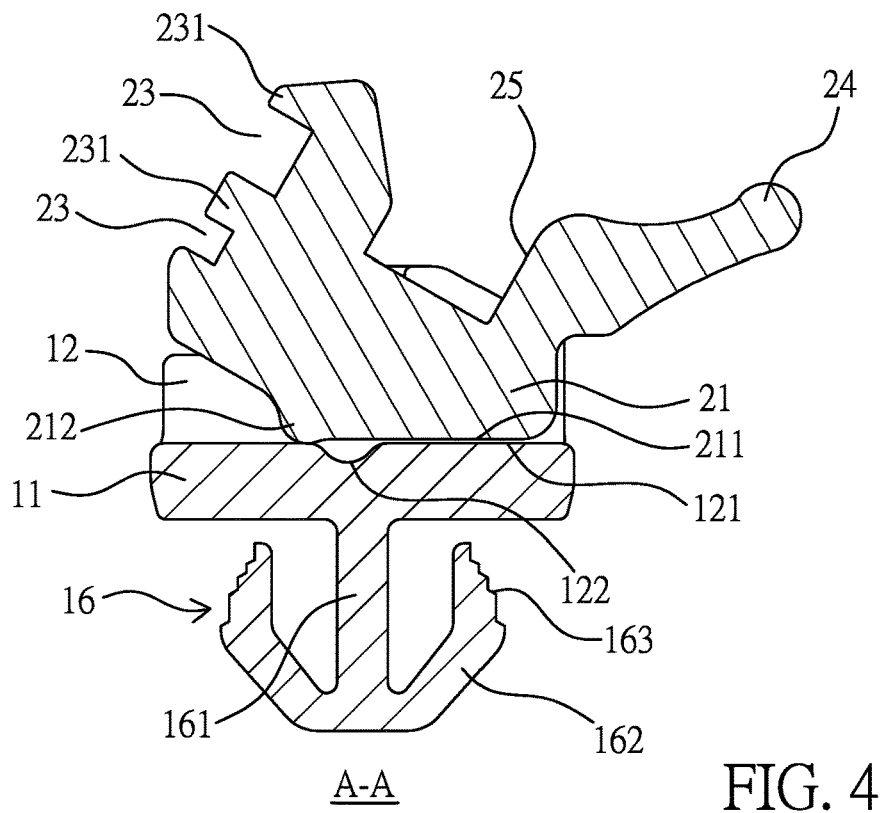
FIG. 4 is a cross sectional view of FIG. 3 taken along an A-A line for illustrating an unlocked status.
Figure 6:
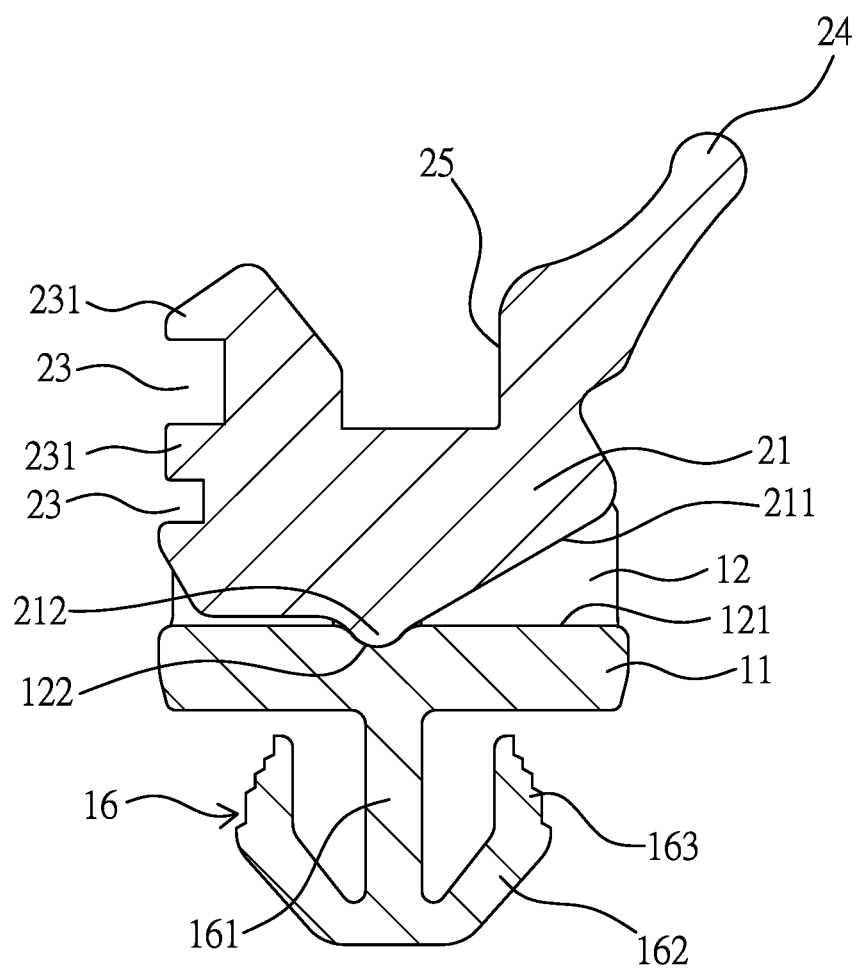
FIG. 6 is a cross sectional view illustrating the sheet member fastener being formed in a locked status according to the first embodiment of the present invention.

Moreover, a block wall 211 on a bottom surface of the rotating part 21 is disposed with a latching hook 212 of the latching structure, and the latching hook 212 is able to be latched in the latching slot 122, another side thereof, for example the front side, is formed with at least one buckling slot 23 capable of being buckled with the second sheet member 4; for enabling the second sheet member 4 to be provided with an anti-releasing effect, a top end of each of the buckling slots 23 is disposed with a pressing piece 231. As shown in FIG. 1, there are two buckling slots 23 which are spaced with an interval, the height and the depth of the buckling slots 23 can be adjusted with respect to the thickness of the second sheet member 4, thereby providing stable combining and positioning effects. Another side of the rotating part 21, for example the rear side, is obliquely extended with a pushing rod 24. When being operated, the pair of pivotal shafts 22 are served as a pivot, the pushing rod 24 is clockwise or counterclockwise pushed for enabling the at least one buckling slot 23 at the opposite side to generate a reverse rotation, for example a counterclockwise or a clockwise motion, so that the latching hook 212 is released from the latching slot 122, and the at least one buckling slot 23 is released from the second sheet member 4 for forming an unlocked status (as shown in FIG. 4); or the latching hook 212 is latched in the latching slot 122 for enabling the at least one buckling slot 23 to be buckled with the second sheet member 4 for forming a locked status (as shown in FIG. 6).

What shall be addressed is that the arrangement of the latching hook 212 and the latching slot 122 is not limited to the above mentioned arrangement, in other words the latching hook can be formed on the bottom wall 121 inside the recess 12, the latching slot can be formed on the block wall 211 at the bottom surface of the rotating part 21, and the same locked status can also be achieved.

Figure 18:
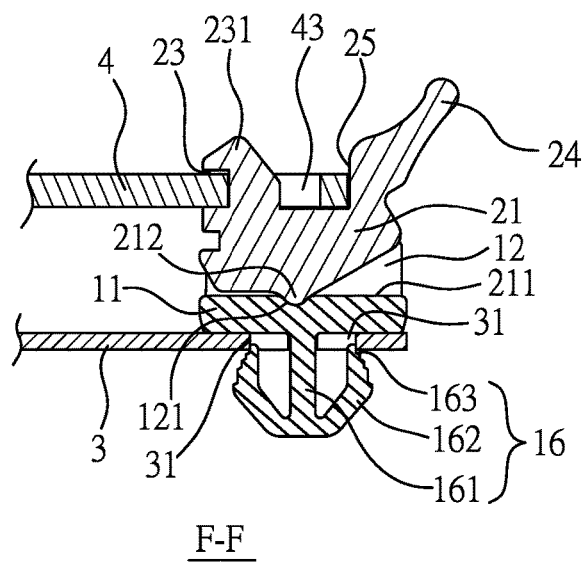
FIG. 18 is a cross sectional view of FIG. 17 taken along an F-F line.

Moreover, an abutting rod 25 is disposed between the rotating part 21 and the pushing rod 24, when the buckling unit 2 is in the locked status relative to the positioning unit 1, the abutting rod 25 is abutted against an edge of the second sheet member 4 (as shown in FIG. 18), so that a disadvantage of the second sheet member 4 transversally sliding can be avoided. When the block wall 211 is abutted against the bottom wall 121, a limitation for the pushing rod 24 being clockwise pushed is formed. When the latching hook 212 is latched in the latching slot 122, a limitation for the pushing rod 24 being counterclockwise pushed is formed.

Figure 9:
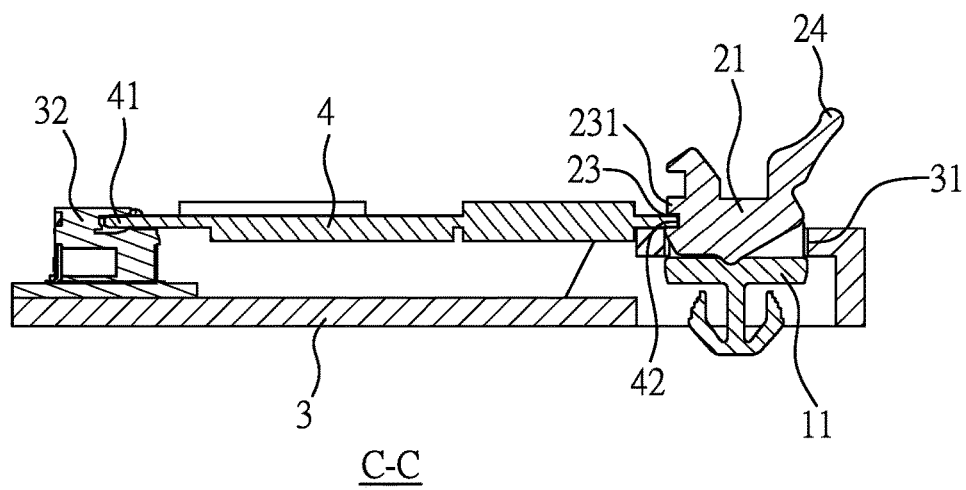
FIG. 9 is a cross sectional view of FIG. 8 taken along a C-C line.

Please refer from FIG. 7 to FIG. 9, which disclose a process of the sheet member fastener being combined with the first sheet member 3 and the second sheet member 4 according to the first embodiment of the present invention; wherein a circuit board is adopted as the first sheet member 3, and a WIFI wireless network card, a 3G network card or a M2.0 solid state hard drive is adopted as the second sheet member 4. When an assembling procedure is processed by the personnel in an assembly factory, the first fastening structure 15 of the positioning unit 1 is aimed at the first sheet hole 31, formed as an elongated round hole, of the first sheet member 3 so as to be inserted, so that the connecting hooks 151 at the outer circumference of the main body 11 are compressed by the first sheet hole 31 for generating an inward deformation so as to pass the first sheet hole 31 until the pair of protrusions 152 are abutted against a top surface defined at the circumference of the first sheet hole 31, so that the first sheet hole 31 is connected and buckled in the connecting slot 153 between the pair of protrusions 152 and the connecting hooks 151.

Then, a contacting part 41 at one end of the second sheet member 4 is inserted into a connector 32 disposed on the first sheet member 3; a positioning hole 42 at another end thereof is downwardly displaced and received in one of the buckling slots 23, for example the buckling slot 23 at the bottom. At this moment, the pushing rod 24 is counterclockwise pushed by the personnel for allowing the buckling slot 23 at the opposite side to be clockwise displaced, so that the positioning hole 42 of the second sheet member 4 is downwardly displaced along the bottom guiding inclined surface 172 at the top end of the vertical post 171 so as to enter the supporting concave part 17, and the latching hook 212 of the buckling unit 2 is latched in the latching slot 122 of the positioning unit 1, thus the second sheet member 4 is formed in the locked status, and the pressing piece 231 located above the buckling slot 23 is served to press the second sheet member 4 (as shown in FIG. 9), so that the sheet member fastener is able to be fastened with the first sheet member 3, and the second sheet member 4 is provided with a stable positioning effect; accordingly, a situation of shaking can be prevented, and the electrical connection between the second sheet member 4 and the connector 32 can be ensured.

Figure 12:
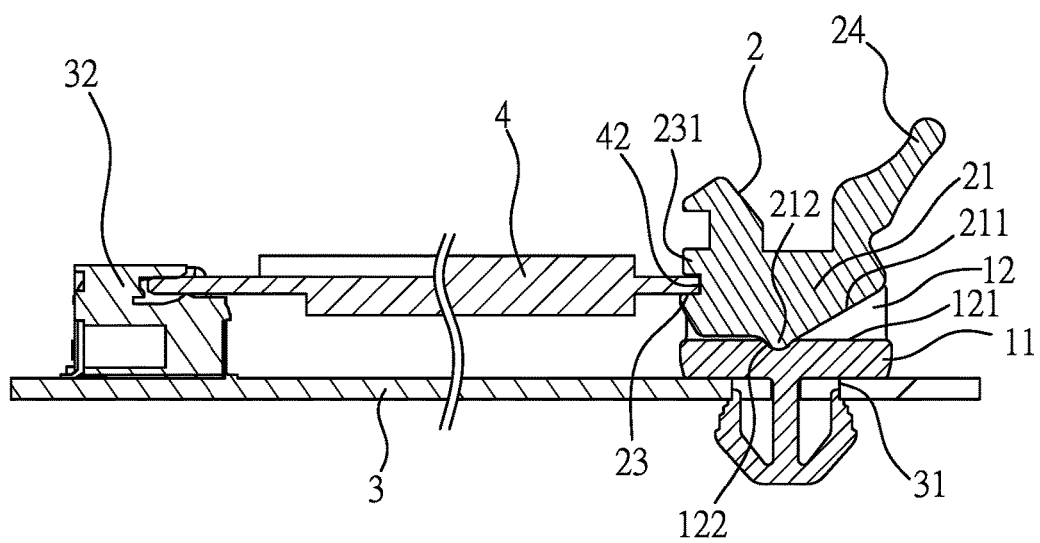
FIG. 12 is a cross sectional view of FIG. 11 taken along a D-D line.

Please refer from FIG. 10 to FIG. 12, which disclose another process of the sheet member fastener being combined with the first sheet member 3 and the second sheet member 4 according to the first embodiment of the present invention; wherein a circuit board is adopted as the first sheet member 3, and a WIFI wireless network card, a 3G network card and a M2.0 solid state hard drive is adopted as the second sheet member 4. When an assembling procedure is processed by the personnel in an assembly factory, the fastening hook 161 of the second fastening structure 16 of the positioning unit 1 and the pair of elastic hook pieces 162 are aimed at the first sheet hole 31, formed as a cross-shaped hole, of the first sheet member 3 so as to be inserted, so that a pair of the teeth steps 163 of the pair of elastic hook pieces 162 are buckled with a pair of long edges of the first sheet hole 31, and the at least one arc-shaped convex part 164 is latched with a pair of short edges of the first sheet hole 31, thereby preventing the positioning unit 1 from being rotated.

According to this embodiment, the assembling means of the second sheet member 4 and the sheet member fastener is exactly the same of the above-mentioned assembling procedure, therefore no further illustration is provided. As shown in FIG. 12, which discloses a buckled status of the second fastening structure 16 of the positioning unit 1 and the first sheet hole 31 of the first sheet member 3, the positioning unit 1 and the buckling unit 2 are in the locked status, and the pressing piece 231 of the buckling slot 23 is served to press the second sheet member 4 for forming an anti-releasing status. As such, the sheet member fastener is able to be fastened with the first sheet member 3, and the second sheet member 4 is provided with the stable positioning effect; accordingly, a situation of shaking can be prevented, and the electrical connection between the second sheet member 4 and the connector 32 can be ensured.

Figure 13:
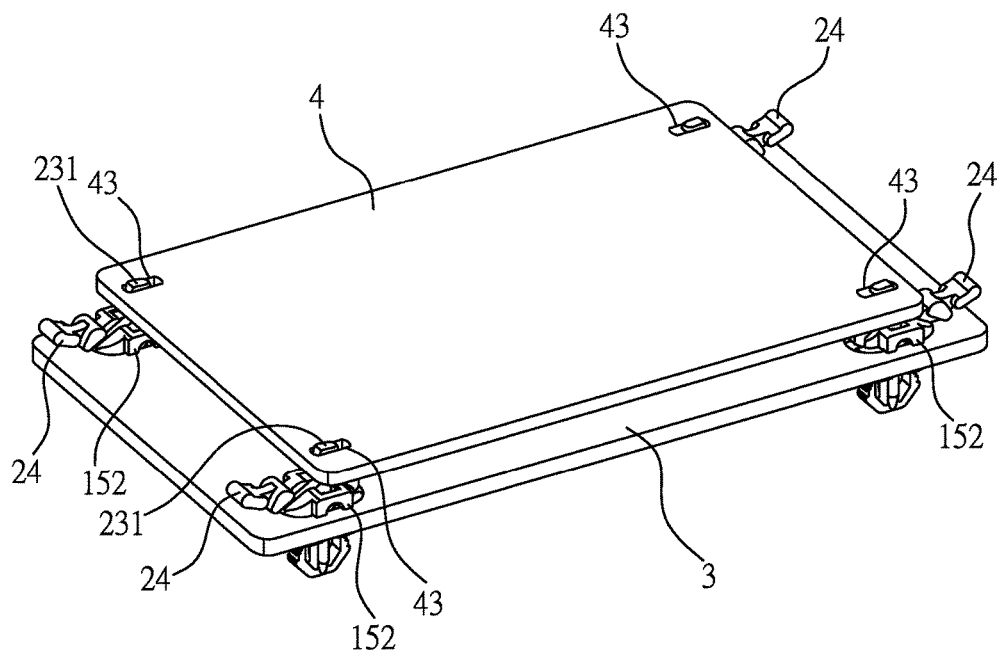
FIG. 13 is a perspective view illustrating a second example showing a process of the first fastening structure of the sheet member fastener being utilized for being combined with the first sheet member and the second sheet member according to the first embodiment of the present invention.
Figure 14:
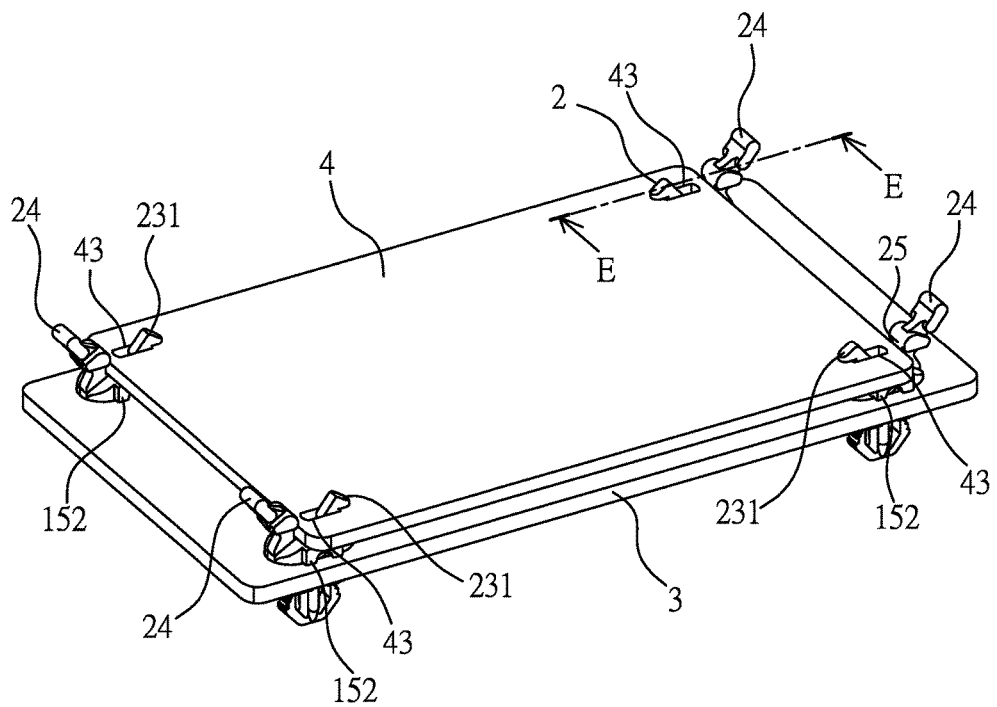
FIG. 14 is another perspective view illustrating the second example showing the process of the first fastening structure of the sheet member fastener being utilized for being combined with the first sheet member and the second sheet member according to the first embodiment of the present invention.
Figure 15:
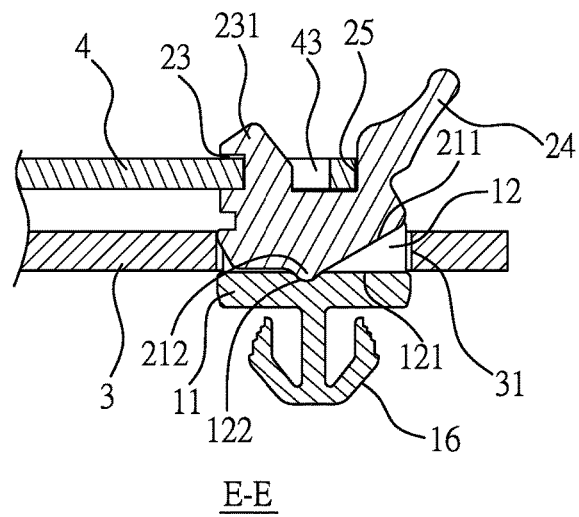
FIG. 15 is a cross sectional view of FIG. 14 taken along an E-E line.

Please refer from FIG. 13 to FIG. 15, which disclose a process of the sheet member fastener being combined with the first sheet member 3 and the second sheet member 4 according to the first embodiment of the present invention; wherein a circuit board is adopted as the first sheet member 3, another circuit board or an assembly board is adopted as the second sheet member 4. When an assembling procedure is processed by the personnel in an assembly factory, the assembling means of the first fastening structure 15 of the positioning unit 1 and the first sheet member 3 is exactly the same of the above-mentioned assembling procedure, therefore no further illustration is provided.

Then, second sheet holes 43, formed in a rectangular shape and arranged at each corner of the second sheet member 4, are respectively received in one of the at least one buckling slot 23 of the buckling unit 2, for example the buckling slot 23 at the top. At this moment, the pushing rod 24 of each of the buckling units 2 is counterclockwise or clockwise pushed by the assembly personnel for enabling the buckling slot 23 at the opposite side to be clockwise or counterclockwise displaced, so that the latching hook 212 of each of the buckling units 2 is latched in the latching slot 122 of each of the positioning units 1, thus the second sheet member 4 is formed in the locked status, and the pressing piece 231 located above each of the buckling slots 23 is served to press the second sheet member 4 in each of the second sheet holes 43 (as shown in FIG. 15), so that the sheet member fastener is able to be fastened with the first sheet member 3, and the second sheet member 4 is provided with the stable positioning effect, thereby preventing the situation of shaking from happening.

Figure 16:
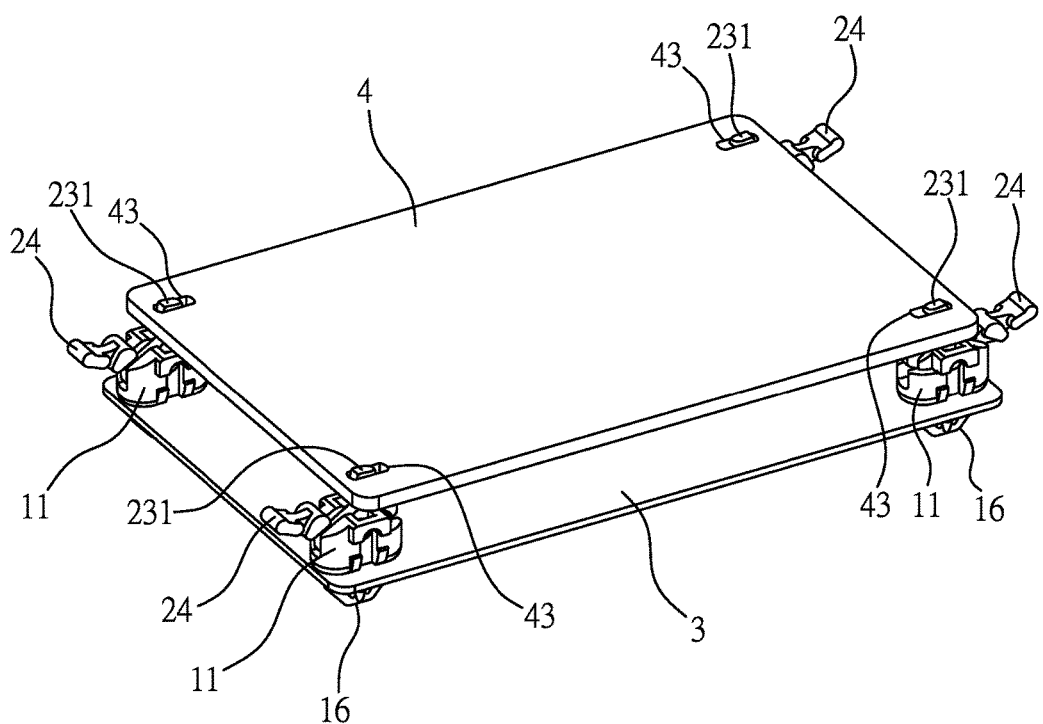
FIG. 16 is a perspective view illustrating the second example showing a process of the second fastening structure of the sheet member fastener being utilized for being combined with the first sheet member and the second sheet member according to the first embodiment of the present invention.
Figure 17:
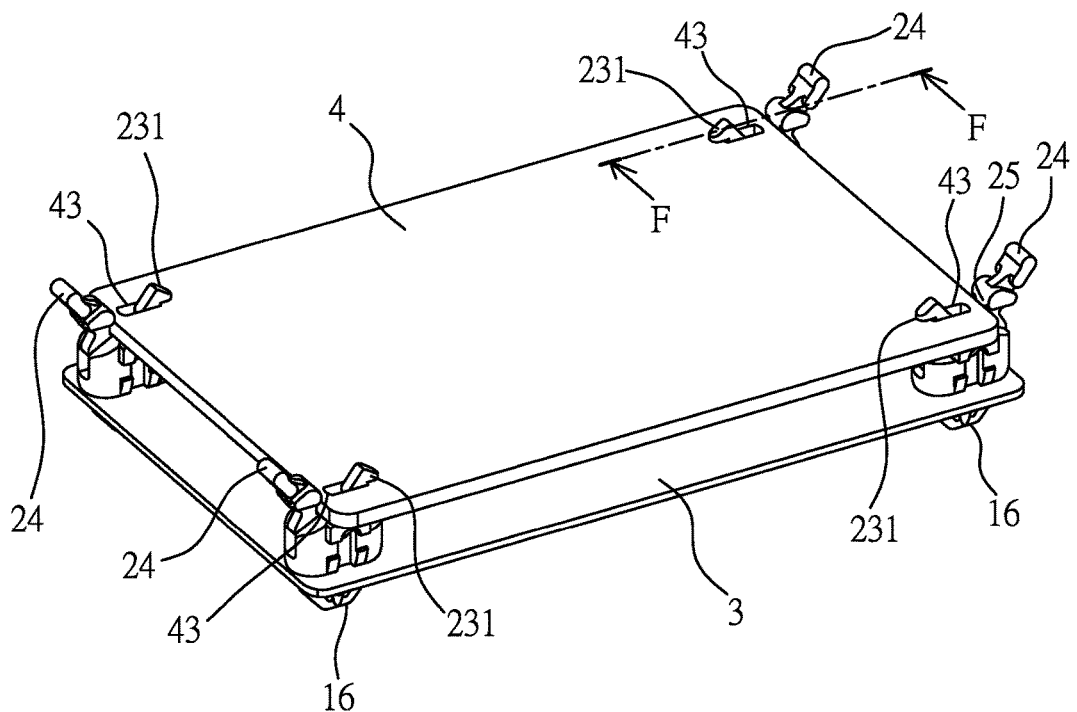
FIG. 17 is another perspective view illustrating the second example showing the process of the second fastening structure of the sheet member fastener being utilized for being combined with the first sheet member and the second sheet member according to the first embodiment of the present invention.

Please refer from FIG. 16 to FIG. 18, which disclose a process of the sheet member fastener being combined with the first sheet member 3 and the second sheet member 4 according to the first embodiment of the present invention; wherein a circuit board is adopted as the first sheet member 3, another circuit board or an assembly board is adopted as the second sheet member 4. When an assembling procedure is processed by the personnel in an assembly factory, the assembling means of the second fastening structure 16 of the positioning unit 1 and the first sheet member 3 is exactly the same of the above-mentioned assembling procedure, therefore no further illustration is provided. According to this embodiment, the assembling means of the second sheet member 4 and the sheet member fastener is exactly the same of the above-mentioned assembling procedure, therefore no further illustration is provided. As shown in FIG. 18, which discloses a buckled status of the second fastening structure 16 of the positioning unit 1 and the first sheet hole 31 of the first sheet member 3, the positioning unit 1 and the buckling unit 2 are in the locked status, and the pressing piece 231 of the buckling slot 23 is served to press the second sheet member 4 for forming the anti-releasing status, and the abutting rod 25 is abutted against the edge of the second sheet member 4 for forming an anti-sliding status. As such, the sheet member fastener is able to be fastened with the first sheet member 3, and the second sheet member 4 is provided with the stable positioning effect; accordingly, a situation of shaking can be prevented.

Figure 19:
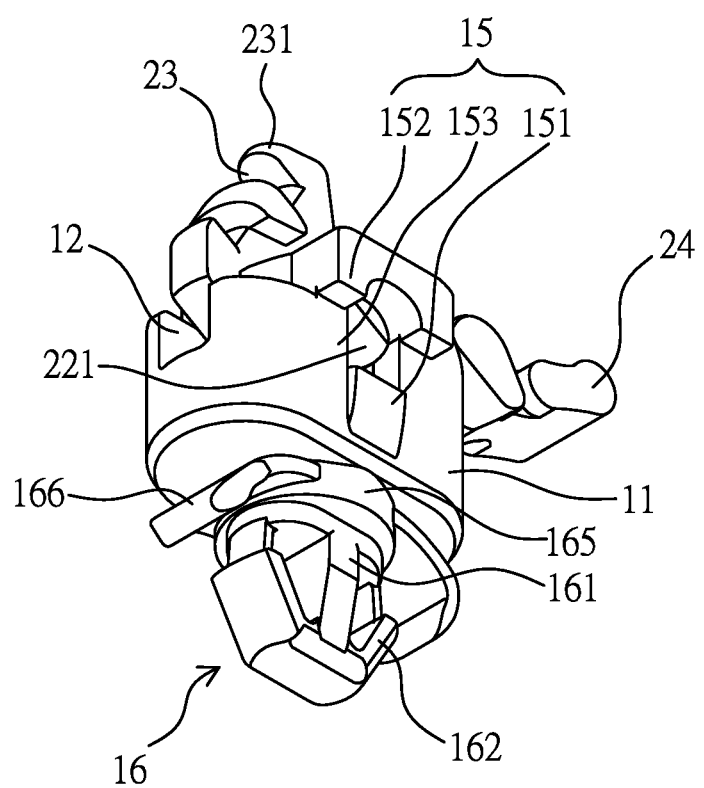
FIG. 19 is a perspective view illustrating the sheet member fastener according to a second embodiment of the present invention.

Please refer to FIG. 19, which discloses a second embodiment of the sheet member fastener provided by the present invention, the same codes (marks) shared by this embodiment and the first embodiment are defined as the same components, because there are many components shared by this embodiment and the first embodiment, there is only one difference between this embodiment and the first embodiment, which is the second fastening structure 16. According to this embodiment, the second fastening structure 16 has the arrow-shaped fastening hook 161 protruded from the bottom end of the main body 11, one free end of the fastening hook 161 is outwardly extended with the pair of elastic hook pieces 162, a fastening block 165 having the same shape as the first sheet hole 31 and having a circular or a non-circular cross section is formed at a connecting location of the fastening hook 161 and the main body 11, the fastening block 165 is oppositely extended with a pair of elastic fin pieces 166 capable being abutted against the first sheet member 3, so that the first sheet member 3 having different thicknesses can be matched. When being operated, the fastening hook 161 is received in the first sheet hole 31, so that the first sheet hole 31 of the first sheet member 3 is buckled between one free end of the pair of elastic hook pieces 162 and the pair of elastic fin pieces 166.

Figure 20:
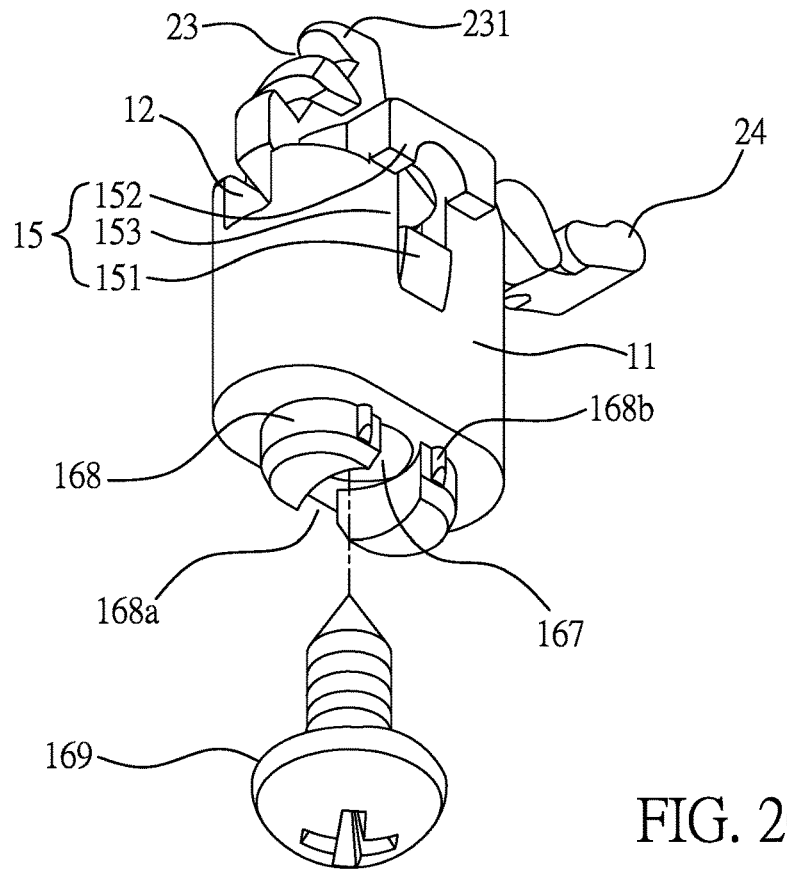
FIG. 20 is a perspective exploded view illustrating the sheet member fastener according to a third embodiment of the present invention.
Figure 21:
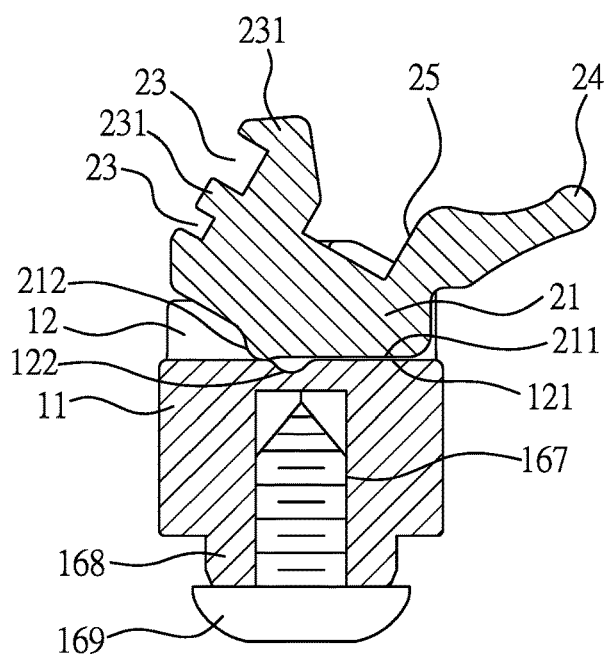
FIG. 21 is a cross sectional view illustrating the assembly of the sheet member fastener shown in FIG. 20 according to the third embodiment of the present invention.

Please refer to FIG. 20 and FIG. 21, which discloses a third embodiment of the sheet member fastener provided by the present invention, the same codes (marks) shared by this embodiment and the first embodiment are defined as the same components, because there are many components shared by this embodiment and the first embodiment, there is only one difference between this embodiment and the first embodiment, which is the second fastening structure 16. According to this embodiment, the second fastening structure 16 has a locking hole 167 longitudinally formed at the bottom end of the main body 11, a pair of semilunar insertion tenons 168 protruded from the bottom end of the main body 11 and oppositely arranged, the pair of insertion tenons 168 are inserted in the first sheet hole 31 having a shape corresponding to the pair of insertion tenons 168, and an arc-shaped slit 168a communicated with the locking hole 167 is formed between the pair of insertion tenons 168; and a locking piece 169 capable of passing the slit 168a and locked in the locking hole 167, thereby enabling the sheet member fastener to be assembled with the first sheet member 3.

According to this embodiment, outer circumferences of a pair of free ends of each of the insertion tenons 168 are formed with a pair of convex tenons 168b, a gap is formed between the convex tenons 168b and the first sheet hole 31 (not show in figures) during a process of the locking piece 169 being locked, so that the free ends are transversally expanded by the locking piece 169 for being abutted against two sides of the first sheet hole 31, and the pair of insertion tenons 168 are aimed at other two sides of the first sheet hole 31 for being squeezed, thereby forming a tight combining relation.

What shall be addressed is that the second fastening structure 16 is not limited to the above mentioned, other fastening structures capable of combining the positioning unit 1 and the various type of first sheet hole 31 of the first sheet member 3 are all within the scope of the present invention.

Based on what has been disclosed above, advantages achieved by the present invention are as followings. The sheet member fastener is provided with a specially-design pivotal connecting mechanism, for example a rapid installing design of the pivotal shafts and the shaft holes having the correspondingly-arranged guiding inclined surfaces, to replace the spring pins of the prior art, so that an operating procedure of aligning a plurality of holes can be saved, the production cost can be effectively lowered and advantages of reducing labor and working hours are also provided. Moreover, the sheet member fastener is provided with two kinds of fastening structures, so that the proper fastening structure can be selected with respect to the actual height of the interval. Furthermore, the buckling unit is formed with the at least one buckling slot capable of matching with the desired second sheet member having different specifications, so that the applicable range is expanded and the flexibility in assembly is also provided. Accordingly, the sheet member fastener provided by the present invention is novel and more practical in use comparing to the prior art.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific examples of the embodiments disclosed and that modifications and other embodiments are intended to be included within the scope of the appended claims. Although specific terms are employed herein, they are used in a generic and descriptive sense only and not for purposes of limitation.

What is claimed is:

1. A sheet member fastener, including:
a positioning unit, having a main body transversally formed with a recess at a top end, wherein a pair of lateral walls are defined at two opposite sides of said recess, said pair of lateral walls are oppositely formed with a pair of shaft holes, a first guiding inclined surface is formed at a top end of each of said shaft holes, and a surface of said main body is disposed with a first fastening structure and/or a second fastening structure allowing a first sheet member to be connected and fastened; and
a buckling unit, having a rotating part received in said recess, wherein two sides of said rotating part are disposed with a pair of pivotal shafts arranged correspondingly towards said pair of shaft holes, and one free end of each of said pivotal shafts is formed with a second guiding inclined surface capable of being longitudinally and downwardly displaced along said corresponding first guiding inclined surface, thereby allowing said pair of pivotal shafts to be pivoted in said pair of shaft holes; wherein a latching slot is formed on a bottom wall at a bottom end defined inside said recess, a latching hook is disposed on a block wall defined at a bottom end of said rotating part, and said latching slot and said latching hook are able to be mutually latched; one side of said rotating part is formed with at least one buckling slot capable of being buckled with a second sheet member, another side thereof is obliquely extended with a pushing rod; said at least one buckling slot is able to generate a reverse rotation through said pushing rod being pushed, so that said latching hook is released from said latching slot, and said at least one buckling slot is released from said second sheet member so as to form an unlocked status; or said latching hook is latched in said latching slot for enabling said at least one buckling slot to be buckled with said second sheet member so as to form a locked status.

2. The sheet member fastener as claimed in claim 1, wherein a pressing piece is disposed above said at least one buckling slot.

3. The sheet member fastener as claimed in claim 1, wherein said first fastening structure is disposed on outer circumferences of said pair of lateral walls, and has at least one connecting hook disposed on each of said lateral walls, and a protrusion disposed on said at least one connecting hook and spaced with intervals, so that a connecting slot capable of being connected and buckled with said first sheet member is formed between said at least one connecting hook and said protrusion of each of said lateral walls.

4. The sheet member fastener as claimed in claim 3, wherein each of said connecting slots is formed in a planar status; and each of said first guiding inclined surfaces is formed on a top surface of said protrusion of each of said lateral walls, and arranged to be adjacent to said shaft hole located below.

5. The sheet member fastener as claimed in claim 3, wherein said pair of lateral walls are formed with a pair of supporting concave parts oriented towards said second sheet member and used for supporting said second sheet member, said pair of supporting concave parts are separated by said recess, located in front of said pair of protrusions and a height thereof is lower than that of said pair of protrusions.

6. The sheet member fastener as claimed in claim 5, wherein an adjacent surface of each of said protrusions and each of said supporting concave parts is disposed with a vertical post, a top surface of said vertical post is formed with a bottom guiding inclined surface, so that said second sheet member is able to be guided into said supporting concave part along said bottom guiding inclined surface so as to be positioned.

7. The sheet member fastener as claimed in claim 1, wherein said second fastening structure is disposed at said bottom end of said main body, and has an arrow-shaped fastening hook protruded from said bottom end of said main body, a pair of elastic hook pieces outwardly extended from said fastening hook, and a plurality of teeth steps arranged in a stepped means and oppositely formed at free ends of said pair of elastic hook pieces and capable of being buckled in a first sheet hole of said first sheet member.

8. The sheet member fastener as claimed in claim 7, wherein opposite longitudinal surfaces of said fastening hook are protruded with at least one arc-shaped convex part.

9. The sheet member fastener as claimed in claim 1, wherein an abutting rod is disposed between said rotating part and said pushing rod, when said sheet member fastener is in said locked status, said abutting rod is abutted against an edge of said second sheet member, thereby preventing said second sheet member from transversally sliding.

10. The sheet member fastener as claimed in claim 1, wherein when said block wall is abutted against said bottom wall, a limitation for said pushing rod being pushed along one rotating direction is formed; when said latching hook is latched in said latching slot, a limitation for said pushing rod being pushed along another rotating direction is formed.

11. The sheet member fastener as claimed in claim 1, wherein said second fastening structure has an arrow-shaped fastening hook protruded from said bottom end of said main body, a pair of elastic hook pieces are outwardly extended from one free end of said fastening hook, a fastening block having a same shape as a first sheet hole of said first sheet member is formed at a connecting location of said fastening hook and said main body, and said fastening block is oppositely extended with a pair of elastic fin pieces capable being elastically abutted against said first sheet member.

12. The sheet member fastener as claimed in claim 1, wherein said second fastening structure has a locking hole longitudinally formed at said bottom end of said main body, a pair of semilunar insertion tenons are protruded from said bottom end of said main body and oppositely arranged, said pair of insertion tenons are inserted in a first sheet hole formed on said first sheet member and having a shape corresponding to said pair of insertion tenons, and an arc-shaped slit communicated with said locking hole is formed between said pair of insertion tenons, and a locking piece is provided and capable of passing said slit and locked in said locking hole.

13. The sheet member fastener as claimed in claim 12, wherein outer circumferences of a pair of free ends of each of said insertion tenons are oppositely formed with a pair of convex tenons, a gap is formed between said convex tenons and said first sheet hole during a process of said locking piece being locked, so that said free ends are transversally expanded by said locking piece for being abutted against two sides of said first sheet hole, and said pair of insertion tenons are aimed at other two sides of said first sheet hole for being squeezed, thereby forming a tight combining relation.

* * * * *